United States Patent
Shiiya et al.

(10) Patent No.: US 11,398,789 B2
(45) Date of Patent: Jul. 26, 2022

(54) MOTOR CONTROL SYSTEM, MOTOR CONTROL APPARATUS, AND BEARING LIFETIME DIAGNOSIS METHOD

(71) Applicant: KABUSHIKI KAISHA YASKAWA DENKI, Kitakyushu (JP)

(72) Inventors: Misaki Shiiya, Kitakyushu (JP); Masahiro Touchi, Kitakyushu (JP); Motomichi Ohto, Kitakyushu (JP); Sadayuki Sato, Kitakyushu (JP); Hideaki Ike, Kitakyushu (JP); Jiro Muraoka, Kitakyushu (JP)

(73) Assignee: KABUSHIKI KAISHA YASKAWA DENKI, Kitakyushu (JP)

(*) Notice: Subject to any disclaimer, the term of this patent is extended or adjusted under 35 U.S.C. 154(b) by 145 days.

(21) Appl. No.: 16/997,942

(22) Filed: Aug. 20, 2020

(65) Prior Publication Data
US 2020/0382036 A1    Dec. 3, 2020

Related U.S. Application Data

(63) Continuation of application No. PCT/JP2018/006202, filed on Feb. 21, 2018.

(51) Int. Cl.
*H02P 23/00*     (2016.01)
*G01M 13/04*    (2019.01)
(Continued)

(52) U.S. Cl.
CPC ......... *H02P 23/0077* (2013.01); *G01M 13/04* (2013.01); *G01R 31/343* (2013.01); *G05B 23/0283* (2013.01); *H04L 67/125* (2013.01)

(58) Field of Classification Search
CPC .................. H02P 23/0077; G05B 23/0283
(Continued)

(56) References Cited

U.S. PATENT DOCUMENTS 8,294,403 B2 * 10/2012 Haas ................. G05B 19/406
                                                    318/473
9,157,831 B2 * 10/2015 Ogawa ............... B23Q 17/007
(Continued)

FOREIGN PATENT DOCUMENTS

EP    1510805    3/2005
EP    2690516    1/2014
(Continued)

OTHER PUBLICATIONS

International Search Report for corresponding International Application No. PCT/JP2018/006202, dated May 22, 2018.
(Continued)

*Primary Examiner* — David Luo
(74) *Attorney, Agent, or Firm* — Mori & Ward, LLP

(57) ABSTRACT

A motor control system includes a motor and a motor control circuitry. The motor includes a rotation axis and a bearing rotatably supporting the rotation axis. The motor control circuitry is configured to control the motor. The motor control circuitry includes a driving time adding circuit configured to add up a driving time of the motor to obtain an accumulated driving time of the motor, a remaining lifetime calculation circuit configured to calculate a remaining lifetime of the bearing based on a lifetime of the bearing and the accumulated driving time, and a warning outputting circuit configured to output warning information when the remaining lifetime is equal to or less than a threshold.

17 Claims, 6 Drawing Sheets

(51) Int. Cl.
*G01R 31/34* (2020.01)
*G05B 23/02* (2006.01)
*H04L 67/125* (2022.01)

(58) Field of Classification Search
USPC ........................................ 318/806, 767, 727
See application file for complete search history.

(56) References Cited

U.S. PATENT DOCUMENTS

| | | | |
|---|---|---|---|
| 2002/0013639 A1* | 1/2002 | Fujishima | G05B 19/4065 700/169 |
| 2005/0143956 A1 | 6/2005 | Long et al. | |
| 2008/0216576 A1 | 9/2008 | Eckert et al. | |
| 2012/0109539 A1 | 5/2012 | Hasegawa et al. | |
| 2018/0003588 A1 | 1/2018 | Iwanami | |
| 2019/0152497 A1 | 5/2019 | Murata et al. | |

FOREIGN PATENT DOCUMENTS

| | | |
|---|---|---|
| JP | 2003-090868 | 3/2003 |
| JP | 2005-030543 | 2/2005 |
| JP | 2005-269785 | 9/2005 |
| JP | 2007-032712 | 2/2007 |
| JP | 2007-135369 | 5/2007 |
| JP | 2009-501508 | 1/2009 |
| JP | 2012-092910 | 5/2012 |
| JP | 2017-058137 | 3/2017 |
| JP | 2018-004473 | 1/2018 |

OTHER PUBLICATIONS

Written Opinion for corresponding International Application No. PCT/JP2018/006202, dated May 22, 2018.
Japanese Office Action for corresponding JP Application No. 2018-552892, dated Jan. 16, 2019 (w/ English machine translation).
Extended European Search Report for corresponding EP Application No. 18906840.6-1202, dated Oct. 5, 2021.

* cited by examiner

MOTOR CONTROL SYSTEM, MOTOR CONTROL APPARATUS, AND BEARING LIFETIME DIAGNOSIS METHOD

CROSS-REFERENCE TO RELATED APPLICATIONS

The present application is a continuation application of International Application No. PCT/JP2018/006202, filed Feb. 21, 2018. The contents of this applications are incorporated herein by reference in their entirety.

BACKGROUND

Field of the Invention

The embodiments disclosed herein relate to a motor control system, a motor control apparatus, and a bearing lifetime diagnosis method.

Discussion of the Background

JP 2005-269785A discloses a motor that includes bearings (rolling bearings) that rotatably hold the rotation axis of the motor. Each bearing includes: an inner ring and an outer ring, which have annular shapes; and a plurality of balls provided between the inner ring and the outer ring. The gap between the inner ring and the outer ring is filled with grease to make the balls smoothly rollable, ensuring that the balls rotate with minimized friction.

SUMMARY

According to one aspect of the present disclosure, a motor control system includes a motor and a motor control circuitry. The motor includes a rotation axis and a bearing rotatably supporting the rotation axis. The motor control circuitry is configured to control the motor. The motor control circuitry includes a driving time adding circuit configured to add up a driving time of the motor to obtain an accumulated driving time of the motor, a remaining lifetime calculation circuit configured to calculate a remaining lifetime of the bearing based on a lifetime of the bearing and the accumulated driving time, and a warning outputting circuit configured to output warning information when the remaining lifetime is equal to or less than a threshold.

According to another aspect of the present disclosure, motor control apparatus is configured to control a motor that includes a rotation axis and a bearing rotatably supporting the rotation axis. The motor control circuitry includes a driving time adding circuit configured to add up a driving time of the motor to obtain an accumulated driving time of the motor, a remaining lifetime calculation circuit configured to calculate a remaining lifetime of the bearing based on a lifetime of the bearing and the accumulated driving time, and a warning outputting circuit configured to output warning information when the remaining lifetime is equal to or less than a threshold.

According to the other aspect of the present disclosure, a bearing lifetime diagnosis method includes providing motor control circuitry configured to control a motor that includes a rotation axis and a bearing rotatably supporting the rotation axis; adding up, with the motor control circuitry, a driving time of the motor to obtain an accumulated driving time of the motor; calculating, with the motor control circuitry, a remaining lifetime of the bearing based on a lifetime of the bearing and the accumulated driving time; and outputting, with the motor control circuitry, warning information when the remaining lifetime is equal to or less than a threshold.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
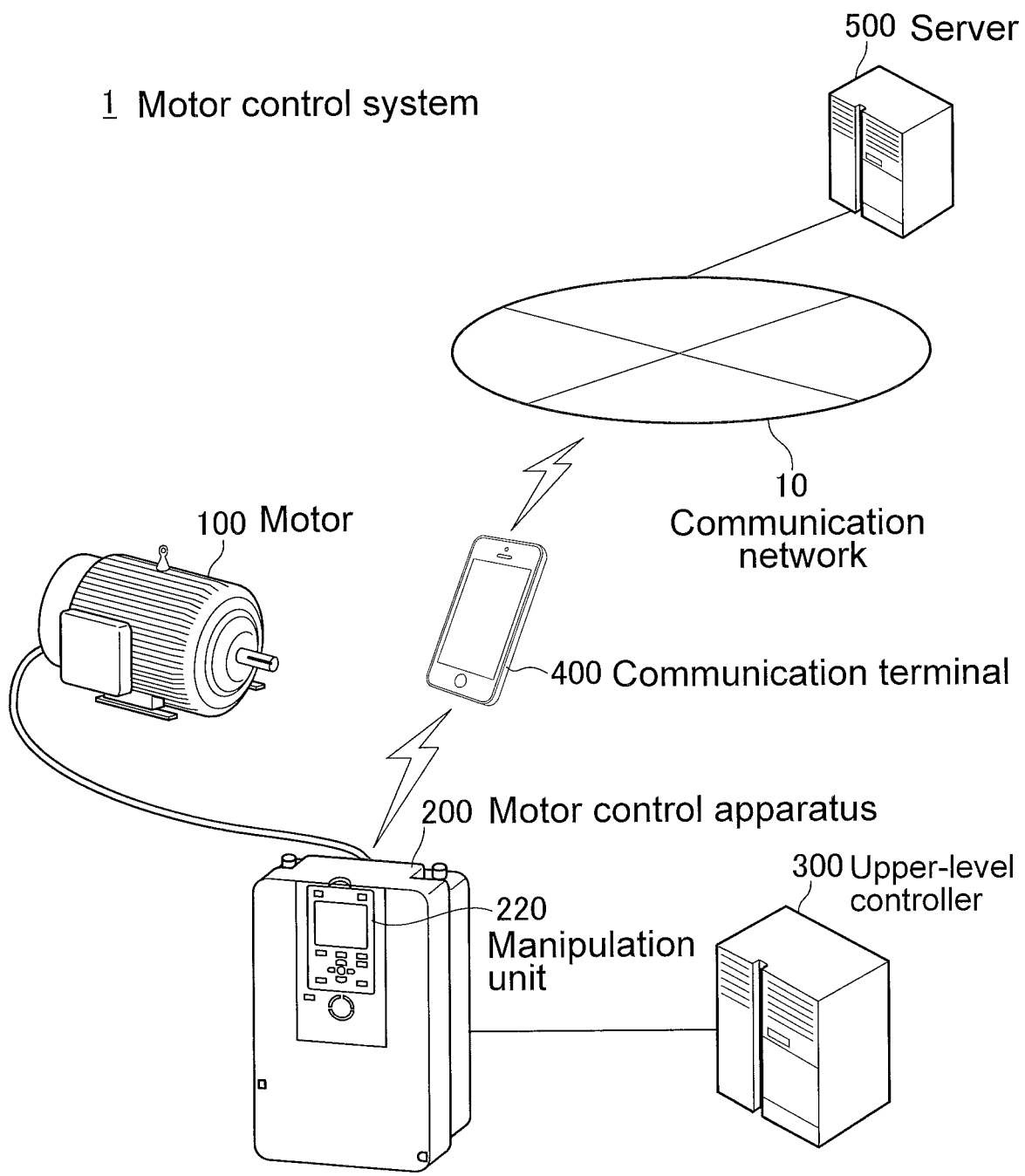
FIG. 1 illustrates a general arrangement of a motor control system according to an embodiment.

The embodiments will now be described with reference to the accompanying drawings, wherein like reference numerals designate corresponding or identical elements throughout the various drawings.

(1) General Arrangement of Motor Control System

FIG. 1 illustrates a general arrangement of a motor control system 1 according to this embodiment.

As illustrated in FIG. 1, the motor control system 1 according to the embodiment includes a motor 100, a motor control apparatus (motor control circuitry) 200, an upper-level controller 300, a communication terminal 400, and a server 500.

The motor 100 is an AC motor driven by the motor control apparatus 200. In the motor 100, bearings 140 (see FIG. 2) are incorporated. The motor 100 may be any kind of motor insofar as the motor includes the bearings 140, examples including an induction motor, a synchronous reluctance motor, a surface permanent-magnet synchronous motor, and an interior permanent-magnet synchronous motor. The motor 100 is connected to the motor control apparatus 200 via an electric power line, enabling the motor control apparatus 200 to control the motor 100 to run or stop and to control the rotational speed of the motor 100.

The motor control apparatus 200 is an apparatus that includes semiconductor switches and, by switching the semiconductor switches, performs conversion of power such as frequency, current, and voltage. The motor control apparatus 200 receives power from a commercial AC power source or a commercial DC power source, converts the power into variable frequency three-phase AC power, and supplies the AC power to the motor 100. The motor control apparatus 200 may be an inverter that drives the motor 100 by controlling the number of rotations of the motor 100 in any manner deemed desired. The motor control apparatus 200 may be a servo controller (servo amplifier) used to drive and control a servo motor used as the motor 100. The motor control apparatus 200 includes a manipulation unit 220. The manipulation unit 220 is connected to the body of the motor control apparatus 200, and is used by a user to make various manipulations with respect to the motor control apparatus 200. The manipulation unit 220 also displays internal states. The manipulation unit 220 may be a removable keypad.

The upper-level controller 300 is an apparatus that makes a command to the motor control apparatus 200 to cause the motor control apparatus 200 to make a predetermined operation. The upper-level controller 300 may be a PLC (Programmable Logic Controller). The upper-level controller 300 executes a program set in advance to change a setting value set in the motor control apparatus 200, thereby controlling the motor control apparatus 200.

The communication terminal 400 is a terminal that is communicable with the motor control apparatus 200 and the server 500. In this embodiment, the communication terminal 400 is a portable device that has a wireless communication function. In FIG. 1, a smartphone is illustrated as an example of the communication terminal 400. The communication terminal 400 may be a terminal other than a smartphone, examples including a PDA terminal, a tablet terminal, and a laptop PC. The communication terminal 400 establishes a wireless connection with the motor control apparatus 200 to display information concerning the motor control apparatus 200 and to execute applications for making various manipulation instructions to the motor control apparatus 200. As a result, the communication terminal 400 is able to remotely make various manipulation instructions to the motor control apparatus 200 and remotely display information.

The server 500 is a network apparatus connected to a communication network 10. The server 500 may be a single server 500 or include a plurality of servers 500. The communication network 10 may be a public communication line such as the Internet. In this embodiment, the communication network 10 includes a wide-area wireless communication network. The server 500 communicates with the motor control apparatus 200 via the communication network 10. The server 500 may indirectly communicate with the motor control apparatus 200 via the communication terminal 400. It is to be noted, however, that the communication between the server 500 and the motor control apparatus 200 is not made by way of the upper-level controller 300. The server 500 may collect information from a large number of motor control apparatuses 200, store the information as an accumulation of big data, and perform machine learning using the big data.

(2) Hardware Configuration of Motor Control System

Figure 2:
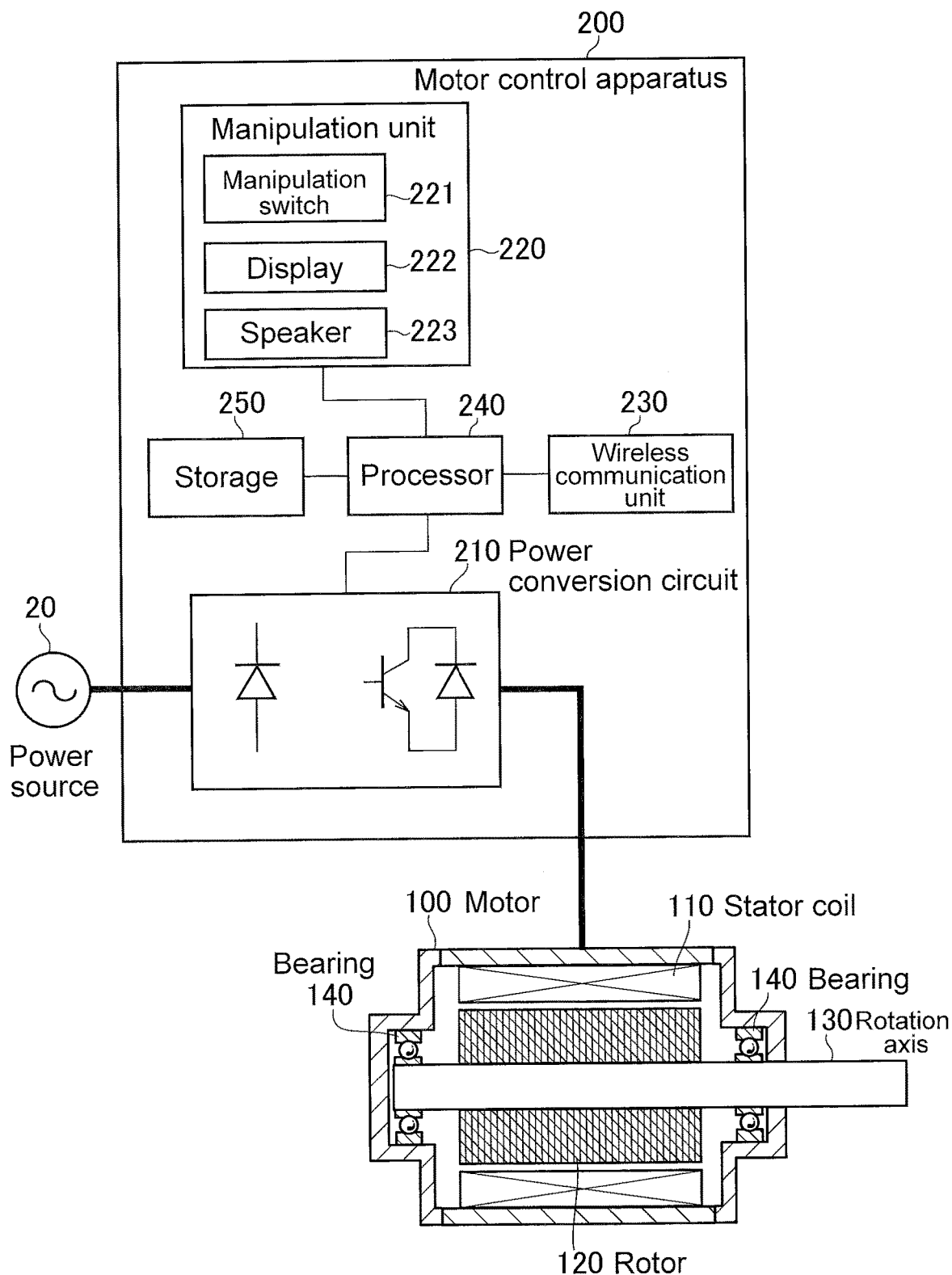
FIG. 2 is a diagram illustrating a hardware configuration of a motor and a motor control apparatus according to the embodiment.

A hardware configuration of the motor control system 1 will be described. FIG. 2 is a diagram illustrating a hardware configuration of the motor 100 and the motor control apparatus 200. In FIG. 2, an internal structure of the motor 100 is schematically illustrated.

As illustrated in FIG. 2, the motor 100 includes a stator coil 110, a rotor 120, a rotation axis 130, and the bearings 140. When power from the motor control apparatus 200 is supplied through the stator coil 110, a rotational magnetic field is formed around the stator coil 110, causing the rotor 120 and the rotation axis 130 to rotate. The rotation axis 130 transmits the rotational force to another mechanical device. It is to be noted that a load acting in the direction along the rotation axis 130 is referred to as thrust load, and a load acting in the direction perpendicular to the rotation axis 130 is referred to as radial load. The rotation axis 130 is rotatably held by the pair of bearings 140. In each of the bearings 140, grease fills the space between the inner ring and the outer ring, and makes the balls in the space smoothly rollable. With this configuration, the bearings 140 rotate with minimized friction. The bearings 140 may be supplied a lubricant from outside the motor 100. The bearings 140 are replaceable parts.

The motor control apparatus 200 includes a power conversion circuit 210, the manipulation unit 220, a wireless communication unit 230, a processor 240, and a storage 250.

The power conversion circuit 210 includes semiconductor switches and, by switching the semiconductor switches, converts power from a power source 20 (which is a commercial AC power source or a commercial DC power source) into variable frequency three-phase AC power. The power conversion circuit 210 may include: a converter section that converts AC power into DC power; a smoothing circuit section that smoothens the DC power; and an inverter section that converts the smoothened DC power into AC power. Operations of the power conversion circuit 210 are controlled by the processor 240.

The manipulation unit 220 includes: a manipulation switch 221, which receives various manipulations made by the user for the motor control apparatus 200; and a display 222, which outputs images. The manipulation switch 221 may be integral to the display 222 to form a touch panel display. The manipulation unit 220 may include a speaker 223, which outputs sound.

The wireless communication unit 230 is made up of elements such as an antenna and a communication-purpose controller. The wireless communication unit 230 establishes a wireless connection with the communication terminal 400 to make wireless communication with the communication terminal 400. The wireless communication that the wireless communication unit 230 makes with the communication terminal 400 complies with a near-field wireless communication standard such as Bluetooth® and Wi-Fi™. The wireless communication unit 230 may be incorporated in the manipulation unit 220.

The processor 240 is connected to the power conversion circuit 210, the manipulation unit 220, the wireless communication unit 230, and the storage 250, and thus controls the operation of the entirety of the motor control apparatus 200. The processor 240 may be an MPU (Micro-Processing Unit). The processor 240 executes programs stored in the storage 250 to perform various kinds of processing.

The storage 250 stores: programs executed by the processor 240; and information used in processing performed by the processor 240. The storage 250 includes a volatile memory and a nonvolatile memory. The volatile memory may be a RAM (Random Access Memory). The nonvolatile memory may be a ROM (Read Only Memory) or an EEPROM (Electrically Erasable Programmable Read Only Memory).

Figure 3:
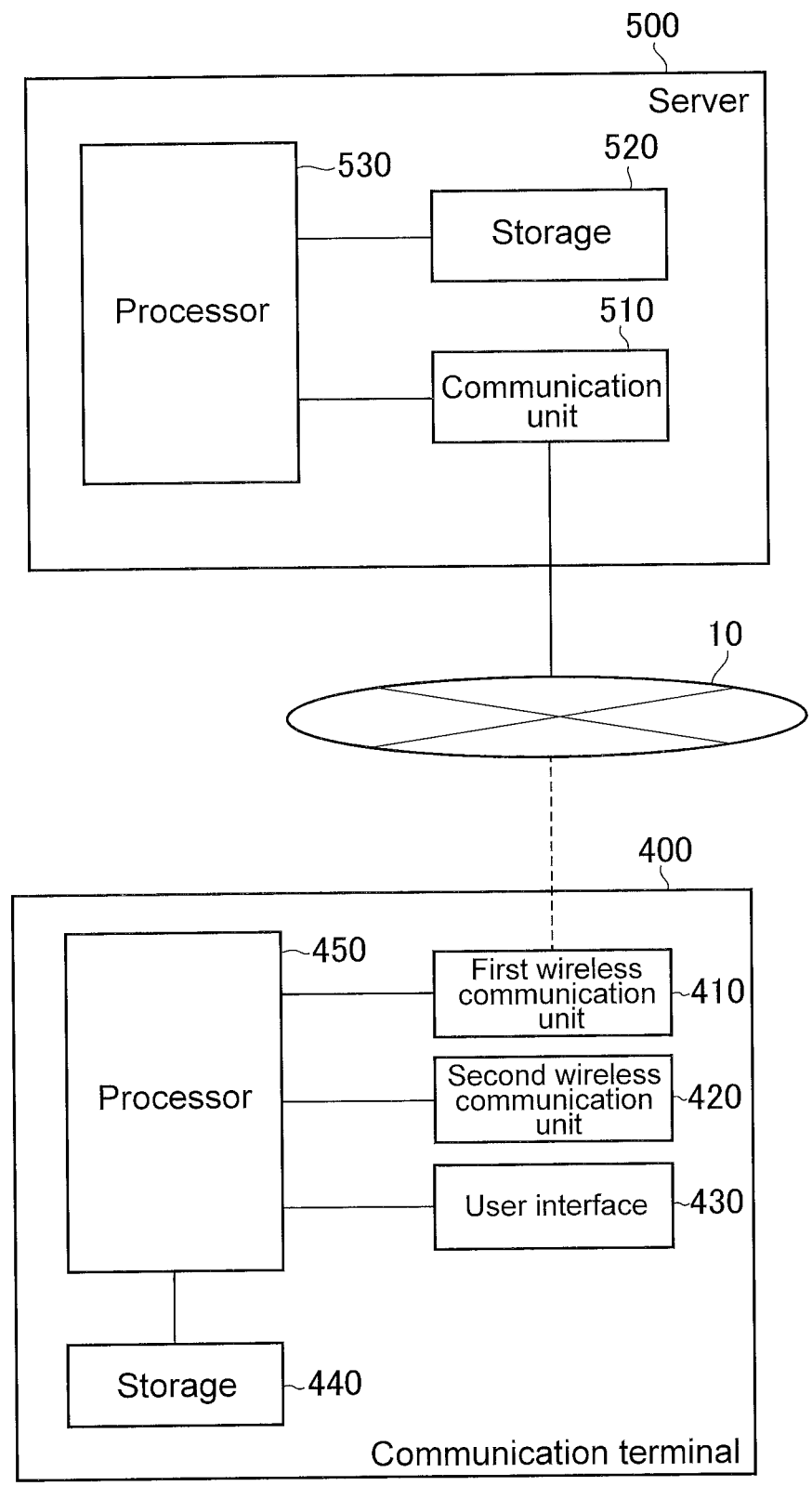
FIG. 3 is a diagram illustrating a hardware configuration of a communication terminal according to the embodiment and a hardware configuration of a server according to the embodiment.

FIG. 3 is a diagram illustrating a hardware configuration of the communication terminal 400 and a hardware configuration of the server 500.

As illustrated in FIG. 3, the communication terminal 400 includes a first wireless communication unit 410, a second wireless communication unit 420, a user interface 430, a storage 440, and a processor 450. The first wireless communication unit 410 establishes a wireless connection with the communication network 10 to make wireless communication with the communication network 10. The wireless communication complies with a wide-area wireless communication standard. The second wireless communication unit 420 establishes a wireless connection with the motor control apparatus 200 to make wireless communication with the motor control apparatus 200. The wireless communication complies with a near-field wireless communication standard. The user interface 430 may include: a manipulation switch that receives various manipulations made by the user; a display that outputs images; a speaker that outputs sound; and a microphone receives sound. The manipulation switch may be integral to the display to form a touch panel display. The storage 440 stores: programs executed by the processor 450; and information used in processing performed by the processor 450. The processor 450 executes the programs stored in the storage 440 to perform various kinds of processing.

The server 500 includes a communication unit 510, a storage 520, and a processor 530. The communication unit 510 is connected to the communication network 10. The storage 520 stores: programs executed by the processor 530; and information used in processing performed by the processor 530. The processor 530 executes the programs stored in the storage 520 to perform various kinds of processing.

(3) Functional Block Configuration of Motor Control System

Figure 4:
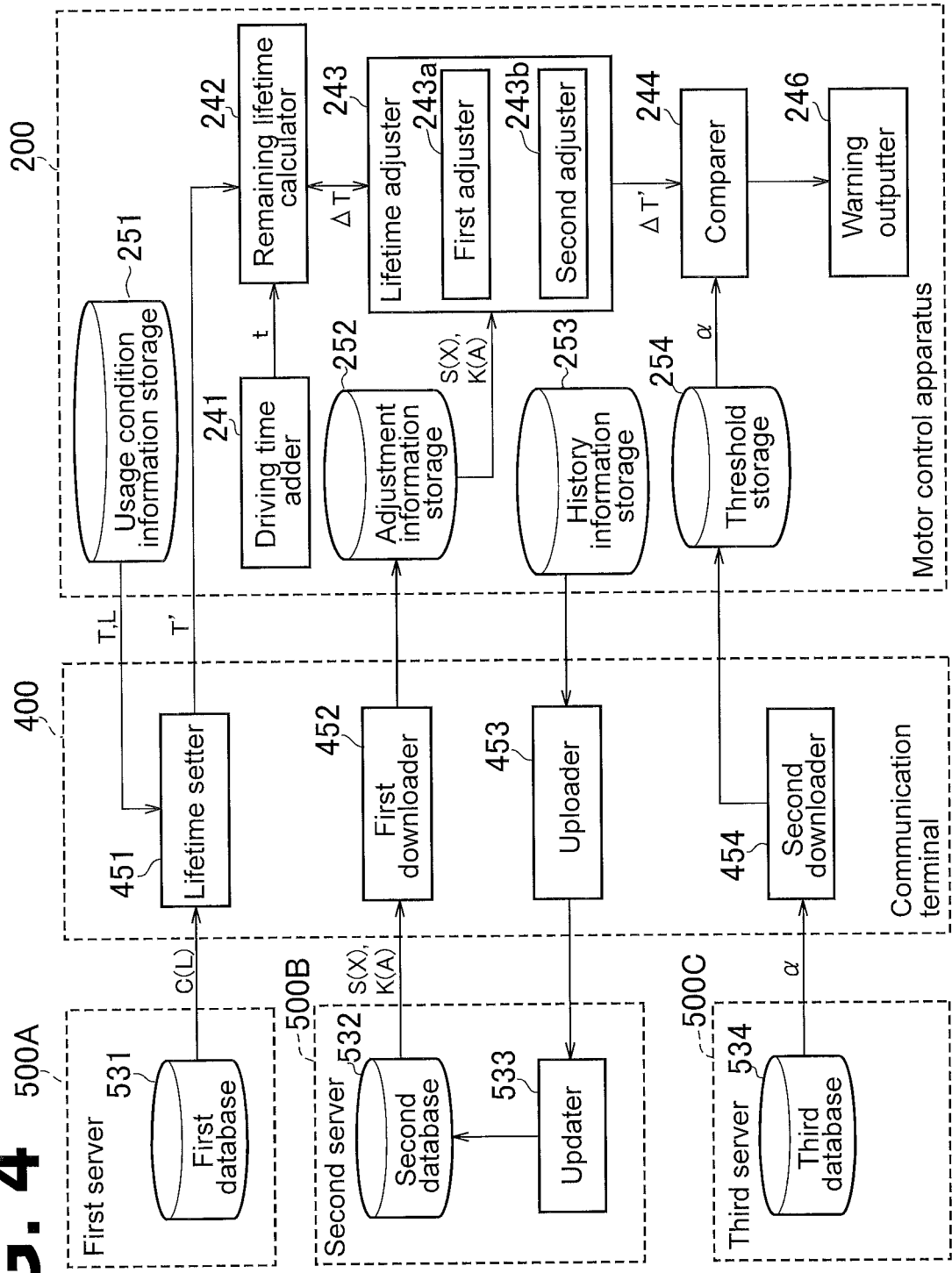
FIG. 4 is a diagram illustrating a functional block configuration of the motor control system according to the embodiment.

Next, description will be made with regard to a functional block configuration of the motor control system 1 associated with lifetime diagnosis of the bearings 140. FIG. 4 is a diagram illustrating a functional block configuration of the motor control system 1.

As illustrated in FIG. 4, the motor control system 1 includes the motor control apparatus 200, the communication terminal 400, a first server 500A, a second server 500B, and a third server 500C. While the following description is regarding an example in which the first server 500A, the second server 500B, and the third server 500C are separate from each other, two or more servers may be integrated into one server.

The motor control apparatus 200 includes a driving time adder 241, a remaining lifetime calculator 242, a remaining lifetime adjuster 243, a comparer 244, a warning outputter 246, a usage condition information storage 251, an adjustment information storage 252, a history information storage 253, and a threshold storage 254.

The communication terminal 400 includes a lifetime setter 451, a first downloader 452, an uploader 453, and a second downloader 454. While the following description is regarding an example in which the lifetime setter 451 is provided in the communication terminal 400, the lifetime setter 451 may be provided in the motor control apparatus 200.

The first server 500A includes a first database 531 (which is a non-limiting example of the first storage recited in the appended claims). The second server 500B includes a second database 532 (which is a non-limiting example of the second storage recited in the appended claims) and an updater 533. The third server 500C includes a third database 534 (which is a non-limiting example of the third storage recited in the appended claims).

In the motor control apparatus 200, the driving time adder 241 (which is a non-limiting example of the driving time adding circuit recited in the appended claims) adds up the driving time of the motor 100, which is a period of time for which the motor 100 is driven, to obtain an accumulated driving time t. Then, the driving time adder 241 outputs the accumulated driving time t. The driving time adder 241 starts adding up the driving time at the time when the motor 100 starts operating after being installed. The driving time adder 241 may stop adding up the driving time while the driving of the motor 100 is suspended. The driving time adder 241 may reset the accumulated driving time t at the time when the bearings 140 of the motor 100 are replaced.

In the communication terminal 400, at the time when, for example, the motor 100 starts operating after being installed, the lifetime setter 451 sets a lifetime T', which is a lifetime unique to each bearing 140. The lifetime setter 451 sets the lifetime T', which is a lifetime unique to the bearing 140, based on: a reference lifetime T, which is a lifetime determined according to a specification of the bearing 140; and usage condition information L, which indicates a usage condition for using the motor 100. The reference lifetime T is a rated lifetime ("catalog value") of the bearing 140, that is, a theoretical lifetime of the bearing 140. The usage condition information L includes at least one of a parameter associated with the motor control apparatus 200 and a parameter associated with the motor 100. Example parameters that may be used include thrust load, radial load, load point, bearing size, grease kind, bearing span, motor rotational speed, and motor torque.

The lifetime setter 451 may obtain the reference lifetime T and the usage condition information L from the usage condition information storage 251. The usage condition information storage 251 stores, in advance, information concerning the motor 100, information concerning the motor control apparatus 200, and information input from the user through the manipulation terminal 220. Alternatively, the lifetime setter 451 may obtain the reference lifetime T and the usage condition information L based on information input from the user through the communication terminal 400. The lifetime setter 451 may obtain the reference lifetime T from the first database 531.

In the first server 500A, the first database 531 stores a lifetime setting information C(L), which indicates a relationship that the lifetime T' has with the reference lifetime T and the usage condition information L. The lifetime setting information C(L) is a calculation formula or a table for identifying the lifetime T' based on the usage condition information L. The lifetime setter 451 sets the lifetime T' that has been identified based at least on the usage condition information L and the lifetime setting information C(L). The lifetime setting information C(L) may have such a configuration that as the thrust load and/or radial load increases, the lifetime T' decreases on a large scale as compared with the reference lifetime T. The lifetime setting information C(L) may have such a configuration that as the motor rotational speed and/or the motor torque increases, the lifetime T' decreases on a large scale as compared with the reference lifetime T. For example, the lifetime T' may be calculated by solving the following Formula (1).

$$T' = T \times C(L) \qquad (1)$$

The lifetime setter 451 may obtain the lifetime setting information C(L) from the first server 500A and identify the lifetime T' based on the lifetime setting information C(L) obtained from the first server 500A and based on the usage condition information L. In this case, the lifetime setter 451 may provide an ID of the motor 100 to the first server 500A so as to obtain the lifetime setting information C(L) from the first server 500A.

Alternatively, instead of the lifetime setter 451 identifying the lifetime T', the first server 500A may identify the lifetime T' using at least the usage condition information L and the lifetime setting information C(L). In this case, the lifetime setter 451 provides the reference lifetime T and the usage condition information L to the first server 500A so as to obtain the lifetime T' identified by the first server 500A.

In the motor control apparatus 200, the remaining lifetime calculator 242 (which is a non-limiting example of the remaining lifetime calculation circuit recited in the appended claims) calculates a remaining lifetime $\Delta T$ of the bearing 140 based on the lifetime T' set by the lifetime setter 451 and based on the accumulated driving time t output from the driving time adder 241. For example, the remaining lifetime calculator 242 subtracts the accumulated driving time t from the lifetime T' as represented by the following Formula (2), thereby calculating the remaining lifetime $\Delta T$.

$$\Delta T = T' - t \quad (2)$$

In the motor control apparatus 200, based on a driving result of the motor 100, which is obtained by driving the motor 100, the lifetime adjuster 243 (which is a non-limiting example of the lifetime adjustment circuit recited in the appended claims) adjusts the remaining lifetime $\Delta T$ to a value corresponding to a state unique to the bearing 140. In other words, after the motor 100 starts operating, the lifetime adjuster 243 adjusts the remaining lifetime $\Delta T$ based on a state (degradation state) of the bearing 140 that is operating. The lifetime adjuster 243 may adjust the lifetime T' set by the lifetime setter 451 to indirectly adjust the remaining lifetime $\Delta T$.

The lifetime adjuster 243 may include a first adjuster 243a. The first adjuster 243a (which is a non-limiting example of the first adjustment circuit recited in the appended claims) adjusts the lifetime T' to a value unique to the bearing 140 based on bearing associated information X, which is obtained by an inspection of the bearing 140 and obtained the driving result of the motor 100. When the inspection of the bearings 140 is performed periodically by the user, the user inputs the bearing associated information X into, for example, the manipulation unit 220. The lifetime adjuster 243 obtains the bearing associated information X input by the user. Examples of the bearing associated information X include oil level (oil gauge), oil quantity and oil flow (oil sight), oil leakage, grease leakage, oil ring normal rotation, bearing sound, temperature, and humidity. The first adjuster 243a adjusts the remaining lifetime $\Delta T$ using lifetime adjustment information S(X), which indicates a relationship that the bearing associated information X, which is obtained by the inspection of the bearing 140, has with an adjusted lifetime T". The lifetime adjustment information S(X) is a calculation formula or a table for identifying the adjusted lifetime T" based on the bearing associated information X. The lifetime adjustment information S(X) may have such an example configuration that as the degree of bearing degradation indicated by the bearing associated information X increases, the lifetime T' decreases on a large scale. For example, the adjusted lifetime T" is calculated by solving the following Formula (3).

$$T'' = T' \times S(X) \quad (3)$$

For example, an adjusted remaining lifetime $\Delta T'$ is calculated by solving the following Formula (4).

$$\Delta T' = T'' - t \quad (4)$$

The lifetime adjuster 243 may also include a second adjuster 243b. The second adjuster 243b (which is a non-limiting example of the second adjustment circuit recited in the appended claims) adjusts the lifetime T' to a value unique to the bearing 140 based on a waveform that indicates a driving state of the motor control apparatus 200 and that has been obtained as the driving result of the motor 100. Examples of the driving state of the motor control apparatus 200 include frequency, torque, and current. The waveform indicating the driving state of the motor control apparatus 200 is obtained based on a detection value obtained by a sensor (such as a current sensor and a voltage sensor) provided in the power conversion circuit 210 of the motor control apparatus 200. The second adjuster 243b adjusts the remaining lifetime $\Delta T$ using lifetime adjustment information K(A), which indicates a relationship that the waveform, A, indicating the driving state of the motor control apparatus 200 has with the adjusted lifetime T". The lifetime adjustment information K(A) is a calculation formula or a table for identifying the adjusted lifetime T" based on the waveform A, which indicates the driving state of the motor control apparatus 200. The lifetime adjustment information K(A) may have such an example configuration that as a turbulence (that is, a ripple component) of the waveform indicating the driving state of the motor control apparatus 200 increases, the lifetime T' decreases on a large scale. The adjusted lifetime T" is calculated by solving the above-described Formula (3). The remaining lifetime $\Delta T'$ is calculated by solving the above-described Formula (4).

The lifetime adjustment information (S(X) and K(A)) used by the lifetime adjuster 243 are stored in the adjustment information storage 252. The lifetime adjustment information stored in the adjustment information storage 252 may be updatable by the second server 500B via the communication terminal 400. The second database 532 of the second server 500B stores the lifetime adjustment information (S(X) and K(A)). Each of the information indicates a relationships that the driving result of the motor 100 has with a value corresponding to the state unique to the bearing 140. When the communication terminal 400 communicates with the motor control apparatus 200 and finds that the lifetime adjustment information stored in the second server 500B is an updated version of the lifetime adjustment information that the lifetime adjuster 243 of the motor control apparatus 200 is using, the communication terminal 400 may update the lifetime adjustment information used by the lifetime adjuster 243 to the updated version stored in the second server 500B. Specifically, the first downloader 452 of the communication terminal 400 may compare version information of the lifetime adjustment information stored in the adjustment information storage 252 with version information of the lifetime adjustment information stored in the second database 532. When these pieces of version information are different from each other, the first downloader 452 may substitute the lifetime adjustment information stored in the adjustment information storage 252 with the lifetime adjustment information downloaded from the second database 532. As a result, the lifetime adjuster 243 adjusts the remaining lifetime $\Delta T$ based on the updated lifetime adjustment information.

Further, the second database 532 of the second server 500B may be updated by machine learning. When the uploader 453 of the communication terminal 400 communicates with the motor control apparatus 200, the uploader 453 uploads, to the second server 500B, history information indicating the driving result of the motor 100 accumulating in the history information storage 253 of the motor control apparatus 200. The history information storage 253 accumulates the history information until the history information, which indicates the driving result of the motor 100, is uploaded. The updater 533 (which is a non-limiting example of the updating circuit recited in the appended claims) of the second server 500B updates the lifetime adjustment information stored in the second database 532 by performing learning such as reinforcement learning (for example, knowledge base, statistics base, or neural net base) based on the uploaded history information.

In the motor control apparatus 200, the comparer 244 compares the remaining lifetime ΔT' adjusted by the remaining lifetime adjuster 243 with a threshold α. The threshold α may be zero. When the threshold α is zero, the comparer 244 determines whether the lifetime of the bearing 140 is ended. It is to be noted, however, that when the lifetime of the bearing 140 ends, the bearing 140 may break down, causing an operation failure of the motor 100. Under the circumstances, the threshold α is preferably a value higher than zero. In this embodiment, the threshold storage 254 stores a threshold α set based on at least one of the kind and the application of the motor 100. The comparer 244 compares the remaining lifetime ΔT' with the threshold α stored in the threshold storage 254.

The threshold α stored in the threshold storage 254 may be updatable by the third server 500C via the communication terminal 400. The third database 534 of the third server 500C stores a threshold α that is based on the kind and/or the application of the motor 100. When the communication terminal 400 communicates with the motor control apparatus 200 and finds that the threshold stored in the third server 500C is an updated version of the threshold stored in the threshold storage 254 of the motor control apparatus 200, the communication terminal 400 updates the threshold α stored in the threshold storage 254 to the updated version stored in the third server 500C. Specifically, the second downloader 454 of the communication terminal 400 compares version information of the threshold α stored in the threshold storage 254 with version information of the threshold stored in the third database 534. When these pieces of version information are different from each other, the second downloader 454 substitutes the threshold α stored in the threshold storage 254 with the threshold downloaded from the third database 534.

In the motor control apparatus 200, when the remaining lifetime ΔT' is equal to or less than the threshold α, the warning outputter 246 (which is a non-limiting example of the warning outputting circuit recited in the appended claims) outputs warning information. The warning outputter 246 may output the warning information in the form of an image on the display 222 of the manipulation unit 220. The warning outputter 246 may output the warning information in the form of sound from the speaker 223 of the manipulation unit 220. The warning outputter 246 may output the warning information to the communication terminal 400 via the wireless communication unit 230. The content of the warning information may be any content insofar as the user recognizes a necessity for replacement of the bearing 140. The warning information may include information indicating the remaining lifetime ΔT of the bearing 140.

Thus, the time to replace each bearing 140 can be identified by adding up the driving time of the motor 100 and calculating the remaining lifetime of the bearing 140 based on the lifetime of the bearing 140 and the accumulated driving time. When the remaining lifetime is equal to or less than the threshold, warning information is output to make the user recognize the time to replace the bearing 140.

(4) Bearing Lifetime Diagnosis Flow

Figure 5:
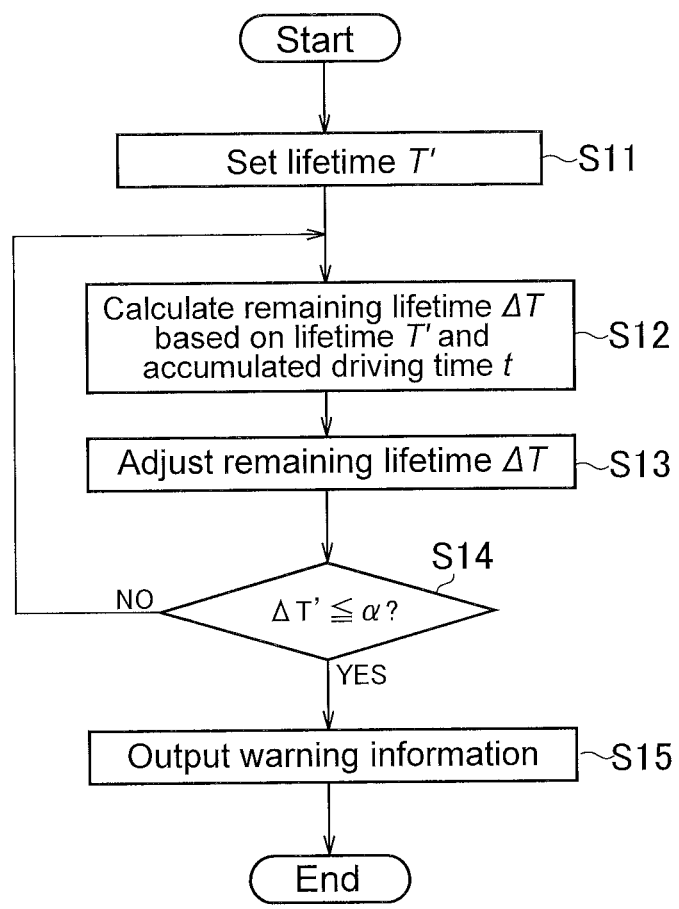
FIG. 5 is a chart illustrating a flow of a bearing lifetime diagnosis performed by the motor control system according to the embodiment.

FIG. 5 is a chart illustrating a flow of a bearing lifetime diagnosis performed by the motor control system 1.

As illustrated in FIG. 5, at step S11, at the time when, for example, the motor 100 starts operating after being installed, the lifetime setter 451 (which is a non-limiting example of the lifetime setting circuit recited in the appended claims) of the communication terminal 400 sets the lifetime which is a lifetime unique to the bearing 140. As described above, the lifetime setter 451 sets the lifetime T', which is a lifetime unique to the bearing 140, based on: the reference lifetime T, which is a lifetime determined according to a specification of the bearing 140; and the usage condition information L, which indicates a usage condition for using the motor 100.

At step S12, the remaining lifetime calculator 242 of the motor control apparatus 200 calculates the remaining lifetime ΔT of the bearing 140 based on the lifetime T' set by the lifetime setter 451 and based on the accumulated driving time t output from the driving time adder 241.

At step S13, the lifetime adjuster 243 of the motor control apparatus 200 adjusts, based on the driving result of the motor 100, the remaining lifetime ΔT to a value corresponding to a state unique to the bearing 140. In other words, after the motor 100 starts operating, the lifetime adjuster 243 adjusts the remaining lifetime ΔT based on a state of the bearing 140 that is operating.

At step S14, the comparer 244 of the motor control apparatus 200 compares the remaining lifetime ΔT' adjusted by the remaining lifetime adjuster 243 with the threshold α. When the remaining lifetime ΔT' is not equal to or less than the threshold α (step S14: No), the processing returns to step S12.

When the remaining lifetime ΔT' is equal to or less than the threshold α (step S14: Yes), the warning outputter 246, at step S15, outputs warning information.

(5) Conclusion of this Embodiment

The motor control apparatus 200 includes: the driving time adder 241, which adds up the driving time of the motor 100 to obtain an accumulated driving time of the motor 100; the remaining lifetime calculator 242, which calculates the remaining lifetime ΔT of the bearing 140 based on the lifetime T' of the bearing 140 and based on the accumulated driving time t; and the warning outputter 246, which outputs warning information when the remaining lifetime ΔT' is equal to or less than the threshold α. This configuration ensures that the time to replace the bearing 140 can be identified by the motor control apparatus 200 when the motor control apparatus 200 adds up the driving time of the motor 100 and calculates the remaining lifetime ΔT of the bearing 140 based on the lifetime of the bearing 140 and the accumulated driving time. When the remaining lifetime ΔT' is equal to or less than the threshold α, the motor control apparatus 200 outputs warning information to make the user recognize the time to replace the bearing 140. When a motor breaks down, there can be consequences such as the production line being forced to stop, causing a great loss in productivity, such as degraded production efficiency and decreased tact time. The embodiment, however, eliminates or minimizes such loss by identifying the time to replace the bearing 140.

In this embodiment, the motor control system 1 may further include the lifetime setter 451. The lifetime setter 451 sets the lifetime T', which is a lifetime unique to the bearing 140, which is incorporated in the motor 100. The lifetime setter 451 sets the lifetime T' based on: the reference lifetime T, which is a lifetime determined according to a specification of the bearing 140; and the usage condition information L, which indicates a usage condition for using the motor 100. In this configuration, the lifetime T' of the bearing 140 is calculated with a usage condition for using the bearings 140 taken into consideration. This ensures that the remaining lifetime ΔT is calculated using a more suitable lifetime T'. In this respect, it is not the remaining lifetime ΔT but the lifetime T' of the bearing 140 that is shortened directly depending on a usage condition. With this configuration, a durability of the bearing 140 determined with a usage condition into consideration is reflected in the lifetime T'. This enables the lifetime to be calculated more accurately in that an aging degradation through a normal usage and a degradation unique to a usage condition are distinguished from each other.

In this embodiment, the motor control system 1 may further include the first server 500A, which includes the first database 531. The first database 531 stores the lifetime setting information C(L), which indicates a relationship that the lifetime T' has with the reference lifetime T and the usage condition information L. The lifetime setter 451 may set a lifetime T' that has been identified based at least on the usage condition information L and the lifetime setting information C(L). With this configuration, the database included in the first server 500A is used, so that the remaining lifetime ΔT is calculated using a more suitable lifetime T'. Also in this configuration, it is not necessary for the motor control apparatus 200 itself to store various relationships; by an operation as simple as updating the storage on the first server 500A side, a bearing lifetime diagnosis made suitable for the kind of motor 100 used can be performed.

In this embodiment, the lifetime setter 451 may set the lifetime T' by identifying the lifetime T' based on the lifetime setting information C(L) obtained from the first server 500A and based on the usage condition information L. In this configuration, the lifetime setter 451 is provided in the communication terminal 400. This eliminates the need for providing the usage condition information L to the first server 500A, ensuring that the lifetime T' can be identified based on the lifetime setting information C(L) obtained from the first server 500A. As a result, the volume of communication traffic to and from the first server 500A is reduced.

In this embodiment, the lifetime setter 451 may set the lifetime T' by obtaining the lifetime T' itself identified by the first server 500A using at least the usage condition information L and the lifetime setting information C(L). In this configuration, the lifetime setter 451 obtains the lifetime T' identified by the first server 500A. This reduces the processing load of the lifetime setter 451 as compared with the case where the lifetime setter 451 identifies the lifetime T'.

In this embodiment, the motor control apparatus 200 may further include the lifetime adjuster 243. The lifetime adjuster 243 adjusts the remaining lifetime ΔT to a value corresponding to a state unique to the bearing 140. The lifetime adjuster 243 adjusts the remaining lifetime ΔT based on the driving result of the motor 100, instead of based on the accumulated driving time t. In this configuration, the lifetime T' is adjusted online (after the motor control apparatus 200 starts operating). This ensures that a lifetime diagnosis is performed accurately for each individual bearing based on its degradation state.

In this embodiment, the motor control system 1 may further include the second server 500B, which includes the second database 532. The second database 532 stores the lifetime adjustment information, which indicates a relationship that the driving result of the motor 100 has with a value corresponding to state unique to the bearing 140. When the communication terminal 400 communicates with the motor control apparatus 200 and finds that the lifetime adjustment information stored in the second server 500B is an updated version of the lifetime adjustment information that the lifetime adjuster 243 of the motor control apparatus 200 is using, the communication terminal 400 may update the lifetime adjustment information used by the lifetime adjuster 243 to the updated version stored in the second server 500B. The lifetime adjuster 243 may adjust the remaining lifetime ΔT based on the updated lifetime adjustment information. This configuration ensures that the remaining lifetime ΔT is adjusted more appropriately using the database included in the second server 500B. This configuration also ensures that when the storage on the second server 500B side has been updated, the lifetime adjustment information used in the motor control apparatus 200 can be updated via the communication terminal 400. Thus, even though the motor control apparatus 200 has no means of communication with the second server 500B, the lifetime adjustment information used in the motor control apparatus 200 can be updated to a new state via the communication terminal 400.

In this embodiment, when the communication terminal 400 communicates with the motor control apparatus 200, the communication terminal 400 may upload, to the second server 500B, the history information, which indicates the driving result of the motor 100 accumulating in the motor control apparatus 200. The second server 500B may further include the updater 533, which updates the lifetime adjustment information based on the history information. In this configuration, the second server 500B updates the lifetime adjustment information based on the history information, which indicates the driving result of the motor 100. This enables the second server 500B to perform learning based on the history information, ensuring that the lifetime adjustment information is updated appropriately.

In this embodiment, the lifetime adjuster 243 may include the first adjuster 243a. The first adjuster 243a adjusts the lifetime T' to a value unique to the bearing 140 based on the bearing associated information X, which is obtained by an inspection of the bearing 140 and obtained as the driving result of the motor 100. This configuration ensures that when an inspection of the bearing 140 is performed after the motor control apparatus 200 starts operating, the remaining lifetime ΔT is adjusted appropriately based on the result of the inspection.

In this embodiment, the lifetime adjuster 243 may include the second adjuster 243b. The second adjuster 243b adjusts the lifetime T' to a value unique to the bearing 140 based on the waveform A, which indicates the driving state of the motor control apparatus 200 and which has been obtained as the driving result of the motor 100. This configuration ensures that the remaining lifetime ΔT is adjusted appropriately based on the waveform A, which indicates a driving state of the motor control apparatus 200.

In this embodiment, the motor control apparatus 200 includes the threshold storage 254 stores the threshold α, which is set based on at least one of the kind and the application of the motor 100. Thus, the threshold α, which is set based on at least one of the kind and the application of the motor 100, is used. Using such threshold α makes it possible to, on an individual motor 100 basis, appropriately set how much time prior the warning information should be output before the lifetime of the bearing 140 ends (that is, how much of a safety margin should be secured).

In this embodiment, the motor control system 1 further includes the third server 500C, which includes the third database 534. The third database 534 stores a threshold that is based on the kind and the application of the motor. When the communication terminal 400 communicates with the motor control apparatus 200 and finds that the threshold stored in the third server 500C is an updated version of the threshold stored in the threshold storage 254 of the motor control apparatus 200, the communication terminal 400 updates the threshold stored in the threshold storage 254 to the updated version stored in the third server 500C. This configuration ensures that the threshold is set appropriately using the database included in the third server 500C. This configuration also ensures that when the storage on the third server 500C side has been updated, the threshold used in the motor control apparatus 200 can be updated via the communication terminal 400. Thus, even though the motor control apparatus 200 has no means of communication with the third server 500C, the threshold used in the motor control apparatus 200 can be updated to a new state via the communication terminal 400.

(6) Other Embodiments

In the above-described embodiment, a portable terminal is described as an example of the communication terminal 400. Alternatively, the communication terminal 400 may be an built-in terminal incorporated in the motor control apparatus 200 (examples including a card terminal and a chip terminal). In this case, the functional blocks of the communication terminal 400 (the lifetime setter 451, the first downloader 452, the uploader 453, and the second downloader 454) are provided in the motor control apparatus 200.

Also, the above-described embodiment provided an example in which the lifetime adjuster 243 adjusts the remaining lifetime ΔT based on the driving result of the motor 100. Alternatively, the adjustment of the remaining lifetime ΔT performed by the lifetime adjuster 243 may be omitted. In this case, the comparer 244 compares the remaining lifetime ΔT calculated by the remaining lifetime calculator 242 with the threshold α.

Also, the above-described embodiment provided an example in which three servers are used, namely, the first to third servers 500A to 500C. Alternatively, it is possible to provide a single server with the functions of the first to third servers 500A to 500C. In this case, the single server includes the first database 531, the second database 532, the updater 533, and the third database 534.

Also, the above-described embodiment provided an example in which the lifetime adjustment information stored in the second database 532 is updated by machine learning. Alternatively, it is possible to update, in a manner using machine learning similar to the manner in which the lifetime adjustment information is updated, the lifetime setting information C(L) stored in the first database 531 and/or the threshold α stored in the third database 534.

Figure 6:
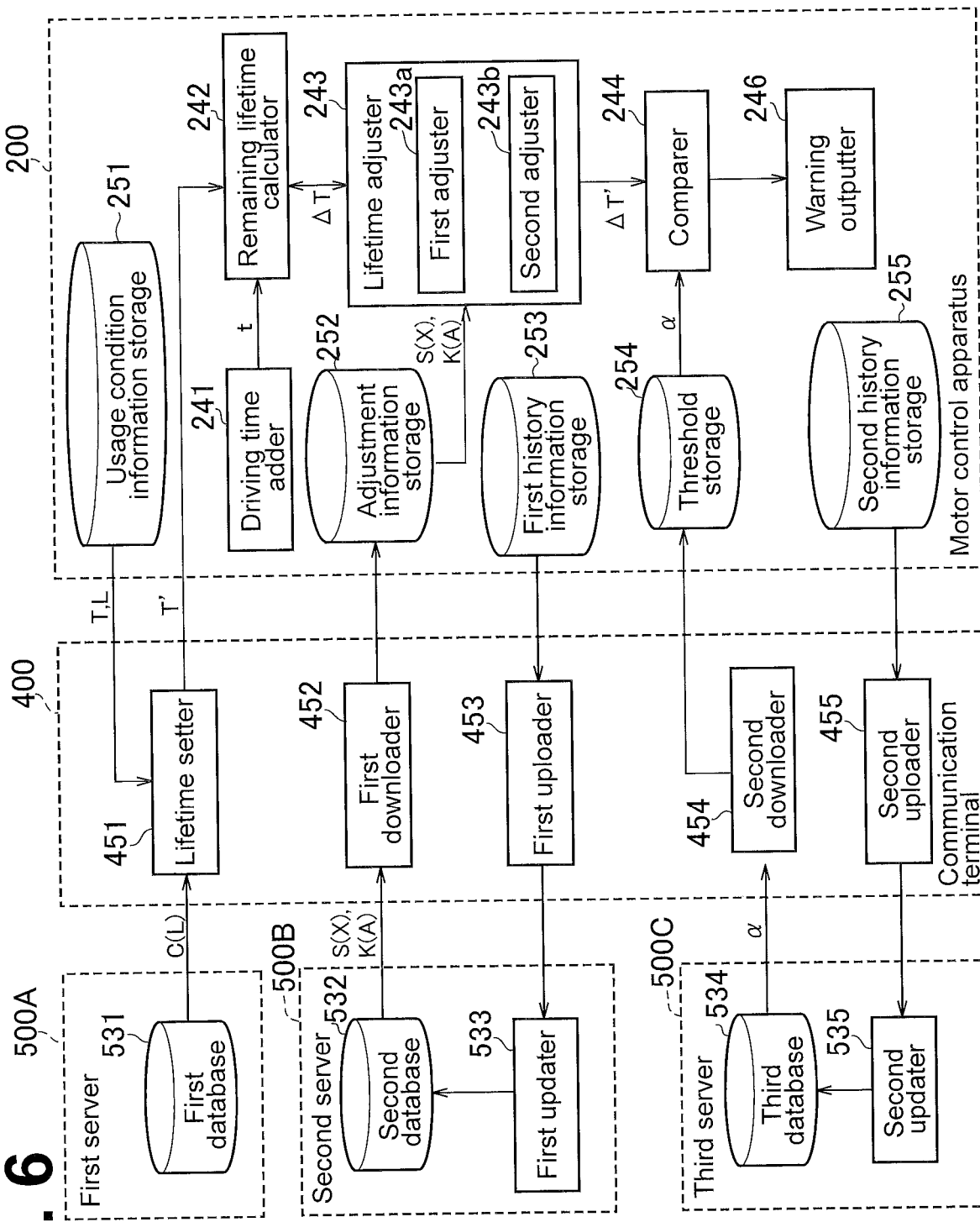
FIG. 6 is a diagram illustrating a functional block configuration of a motor control system according to another embodiment.

By referring to FIG. 6, description will be made with regard to a configuration in which the threshold α stored in the third database 534 is updated by machine learning. As illustrated in FIG. 6, the motor control apparatus 200 includes a second history information storage 255. The second history information storage 255 accumulates the history information, which indicates the driving result of the motor 100. Also, the communication terminal 400 includes a second uploader 455. When the communication terminal 400 communicates with the motor control apparatus 200, the second uploader 455 uploads, to the third server 500C, the history information, which indicates the driving result of the motor 100, accumulating in the second history information storage 255 of the motor control apparatus 200. The third server 500C includes a second updater 535. Based on the uploaded history information, the second updater 535 (which is a non-limiting example of the updating circuit recited in the appended claims) updates the threshold α stored in the third database 534 by performing learning such as reinforcement learning (for example, knowledge base, statistics base, or neural net base) Specifically, the second updater 535 collects and learns a history of failures for each kind of the motor 100 and for each application of the motor 100, and updates the threshold α based on the result of the learning. Examples of the history of failures include: "environment information such as temperature and humidity" at the time when a failure occurred (including timings before and after the time); and/or "driving conditions such as a speed value, a current value, a torque value, and/or a command". Also, remaining lifetimes ΔT corresponding to the respective environment information and/or driving conditions may be used.

As used herein, the term "comprise" and its variations are intended to mean open-ended terms, not excluding any other elements and/or components that are not recited herein. The same applies to the terms "include", "have", and their variations.

As used herein, a component suffixed with a term such as "member", "portion", "part", "element", "body", and "structure" is intended to mean that there is a single such component or a plurality of such components.

As used herein, ordinal terms such as "first" and "second" are merely used for distinguishing purposes and there is no other intention (such as to connote a particular order) in using ordinal terms. For example, the mere use of "first element" does not connote the existence of "second element"; otherwise, the mere use of "second element" does not connote the existence of "first element".

As used herein, approximating language such as "approximately", "about", and "substantially" may be applied to modify any quantitative representation that could permissibly vary without a significant change in the final result obtained. All of the quantitative representations recited in the present application shall be construed to be modified by approximating language such as "approximately", "about", and "substantially".

As used herein, the phrase "at least one of A and B" is intended to be interpreted as "only A", "only B", or "both A and B".

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. A motor control system comprising:
   a motor comprising:
      a rotation axis; and
      a bearing rotatably supporting the rotation axis;
   motor control circuitry configured to control the motor and comprising:
      a driving time adding circuit configured to add up a driving time of the motor to obtain an accumulated driving time of the motor;
      a remaining lifetime calculation circuit configured to calculate a remaining lifetime of the bearing based on a lifetime of the bearing and the accumulated driving time; and
      a warning outputting circuit configured to output warning information when the remaining lifetime is equal to or less than a threshold; and a lifetime setting circuit configured to set, based on a reference lifetime determined according to a specification of the bearing and based on usage condition information indicating a usage condition for using the motor, the lifetime of the bearing.

2. The motor control system according to claim 1, further comprising:
a first server comprising a first storage configured to store lifetime setting information indicating a relationship that the lifetime has with the reference lifetime and the usage condition information,
wherein the lifetime setting circuit is configured to set the lifetime when the lifetime has been identified based at least on the usage condition information and the lifetime setting information.

3. The motor control system according to claim 2, wherein in setting the lifetime, the lifetime setting circuit is configured to identify the lifetime based on the lifetime setting information obtained from the first server and based on the usage condition information.

4. The motor control system according to claim 2, wherein in setting the lifetime, the lifetime setting circuit is configured to obtain the lifetime such that the lifetime has been identified by the first server using at least the usage condition information and the lifetime setting information.

5. The motor control system according to claim 1, further comprising:
a second server comprising a second storage configured to store lifetime adjustment information indicating a relationship that the driving result of the motor has with the value corresponding to the state unique to the bearing; and
a terminal configured to communicate with the second server and the motor control circuitry,
wherein when the terminal communicates with the motor control circuitry and finds that the lifetime adjustment information stored in the second server is an updated version of the lifetime adjustment information that the lifetime adjustment circuit of the motor control circuitry is using, the terminal is configured to update the lifetime adjustment information used by the lifetime adjustment circuit to the updated version stored in the second server, and the lifetime adjustment circuit is configured to adjust the remaining lifetime based on the updated version.

6. The motor control system according to claim 1, wherein the lifetime adjustment circuit comprises a second adjustment circuit configured to adjust the lifetime to a value unique to the bearing based on a waveform that indicates a driving state of the motor control circuitry and that has been obtained as the driving result of the motor.

7. The motor control system according to claim 1, further comprising:
a third server comprising a third storage configured to store the threshold that is based on the kind of the motor and the application of the motor; and
a terminal configured to communicate with the third server and the motor control circuitry,
wherein when the terminal communicates with the motor control circuitry and finds that the threshold stored in the third server is an updated version of the threshold stored in the threshold storage of the motor control circuitry, the terminal is configured to update the threshold stored in the threshold storage to the updated version stored in the third server.

8. A motor control system comprising:
a motor comprising:
a rotation axis; and
a bearing rotatably supporting the rotation axis; and
motor control circuitry configured to control the motor and comprising:
a driving time adding circuit configured to add up a driving time of the motor to obtain an accumulated driving time of the motor;
a remaining lifetime calculation circuit configured to calculate a remaining lifetime of the bearing based on a lifetime of the bearing and the accumulated driving time;
a warning outputting circuit configured to output warning information when the remaining lifetime is equal to or less than a threshold; and
a lifetime adjustment circuit configured to, based on a driving result of the motor obtained by driving the motor instead of based on the accumulated driving time, adjust the remaining lifetime to a value corresponding to a state unique to the bearing.

9. The motor control system according to claim 8, further comprising:
a second server comprising a second storage configured to store lifetime adjustment information indicating a relationship that the driving result of the motor has with the value corresponding to the state unique to the bearing; and
a terminal configured to communicate with the second server and the motor control circuitry,
wherein when the terminal communicates with the motor control circuitry and finds that the lifetime adjustment information stored in the second server is an updated version of the lifetime adjustment information that the lifetime adjustment circuit of the motor control circuitry is using, the terminal is configured to update the lifetime adjustment information used by the lifetime adjustment circuit to the updated version stored in the second server, and the lifetime adjustment circuit is configured to adjust the remaining lifetime based on the updated version.

10. The motor control system according to claim 9,
wherein when the terminal communicates with the motor control circuitry, the terminal is configured to upload, to the second server, history information indicating the driving result of the motor accumulating in the motor control circuitry, and
wherein the second server further comprises an updating circuit configured to update the lifetime adjustment information based on the history information.

11. The motor control system according to claim 8, wherein the lifetime adjustment circuit comprises a first adjustment circuit configured to adjust the lifetime to a value unique to the bearing based on bearing associated information obtained by an inspection of the bearing and obtained as the driving result of the motor.

12. The motor control system according to claim 8, wherein the lifetime adjustment circuit comprises a second adjustment circuit configured to adjust the lifetime to a value unique to the bearing based on a waveform that indicates a driving state of the motor control circuitry and that has been obtained as the driving result of the motor.

13. The motor control system according to claim 12, further comprising:
a second server comprising a second storage configured to store lifetime adjustment information indicating a relationship that the driving result of the motor has with the value corresponding to the state unique to the bearing; and a terminal configured to communicate with the second server and the motor control circuitry, wherein when the terminal communicates with the motor control circuitry and finds that the lifetime adjustment information stored in the second server is an updated version of the lifetime adjustment information that the lifetime adjustment circuit of the motor control circuitry is using, the terminal is configured to update the lifetime adjustment information used by the lifetime adjustment circuit to the updated version stored in the second server, and the lifetime adjustment circuit is configured to adjust the remaining lifetime based on the updated version.

14. A motor control system comprising:
a motor comprising:
   a rotation axis; and
   a bearing rotatably supporting the rotation axis; and
motor control circuitry configured to control the motor and comprising:
   a driving time adding circuit configured to add up a driving time of the motor to obtain an accumulated driving time of the motor;
   a remaining lifetime calculation circuit configured to calculate a remaining lifetime of the bearing based on a lifetime of the bearing and the accumulated driving time;
   a warning outputting circuit configured to output warning information when the remaining lifetime is equal to or less than a threshold; and
   a threshold storage storing the threshold such that the threshold is set based on at least one of a kind of the motor and an application of the motor.

15. The motor control system according to claim 14, further comprising:
a third server comprising a third storage storing the threshold that is based on the kind of the motor and the application of the motor; and
a terminal communicable with the third server and the motor control circuitry,
wherein when the terminal communicates with the motor control circuitry and finds that the threshold stored in the third server is an updated version of the threshold stored in the threshold storage of the motor control circuitry, the terminal is configured to update the threshold stored in the threshold storage to the updated version stored in the third server.

16. The motor control system according to claim 15,
wherein when the terminal communicates with the motor control circuitry, the terminal is configured to upload, to the third server, history information indicating a driving result of the motor accumulating in the motor control circuitry, and
wherein the third server further comprises an updating circuit configured to update the threshold based on the history information.

17. The motor control system according to claim 15, further comprising:
a second server comprising a second storage configured to store lifetime adjustment information indicating a relationship that the driving result of the motor has with the value corresponding to the state unique to the bearing; and
a terminal configured to communicate with the second server and the motor control circuitry,
wherein when the terminal communicates with the motor control circuitry and finds that the lifetime adjustment information stored in the second server is an updated version of the lifetime adjustment information that the lifetime adjustment circuit of the motor control circuitry is using, the terminal is configured to update the lifetime adjustment information used by the lifetime adjustment circuit to the updated version stored in the second server, and the lifetime adjustment circuit is configured to adjust the remaining lifetime based on the updated version.

\* \* \* \* \*